US010677643B2

(12) United States Patent
Allgaier et al.

(10) Patent No.: US 10,677,643 B2
(45) Date of Patent: Jun. 9, 2020

(54) VIBRATION SENSOR AND METHOD FOR OPTIMIZING A PIEZOELECTRIC DRIVE

(71) Applicant: Vega Grieshaber KG, Wolfach (DE)

(72) Inventors: Volker Allgaier, Haslach i. K. (DE); Holger Gruhler, Tuningen (DE); Dominik Fehrenbach, Haslach (DE)

(73) Assignee: Vega Grieshaber KG, Wolfach (DE)

( * ) Notice: Subject to any disclaimer, the term of this patent is extended or adjusted under 35 U.S.C. 154(b) by 0 days.

(21) Appl. No.: 16/319,091

(22) PCT Filed: Jul. 5, 2017

(86) PCT No.: PCT/EP2017/066787
§ 371 (c)(1),
(2) Date: Jan. 18, 2019

(87) PCT Pub. No.: WO2018/015157
PCT Pub. Date: Jan. 25, 2018

(65) Prior Publication Data
US 2019/0376839 A1 Dec. 12, 2019

(30) Foreign Application Priority Data
Jul. 21, 2016 (DE) .......................... 10 2016 113 447

(51) Int. Cl.
*H01L 41/09* (2006.01)
*G01H 11/08* (2006.01)
(Continued)

(52) U.S. Cl.
CPC ............. *G01H 11/08* (2013.01); *G10K 9/122* (2013.01); *H01L 41/042* (2013.01); *H01L 41/1132* (2013.01); *H01L 41/1138* (2013.01)

(58) Field of Classification Search
CPC ...... G01H 11/08; G10K 9/122; H01L 41/042; H01L 41/1132; H01L 41/1138
(Continued)

(56) References Cited

U.S. PATENT DOCUMENTS 5,969,621 A * 10/1999 Getman ................ B06B 1/0622
310/334
6,236,322 B1 * 5/2001 Lopatin ............... G01F 23/2967
340/612
2015/0308888 A1 10/2015 Gruhler

FOREIGN PATENT DOCUMENTS

CA 2281455 2/2002
DE 3931453 2/1991
(Continued)

OTHER PUBLICATIONS

Chinese Intellectual Property Office, "Office Action" and English translation thereof, issued in Chinese Patent Application No. 201780038910.0, dated Jun. 18, 2019, document of 16 pages.
(Continued)

*Primary Examiner* — Thomas M Dougherty
(74) *Attorney, Agent, or Firm* — Akerman LLP; Peter A. Chiabotti

(57) ABSTRACT

The a vibration sensor comprising a membrane that can be stimulated so as to oscillate by means of a piezoelectric drive, and a mechanical oscillator arranged on the membrane, at least one piezoelectric element of the drive comprising at least one first electrical contact structure on an upper side of the piezoelectric element and at least one second electrical contact structure on a lower side of the piezoelectric element, such that the at least one piezoelectric element is designed so that an active area of the piezoelectric element corresponds to an area of a mechanical deformation of the unidirectional curvature of the membrane, during a pre-defined eigenmode of the mechanical oscillator.

15 Claims, 4 Drawing Sheets

(51) Int. Cl.
*G10K 9/122* (2006.01)
*H01L 41/04* (2006.01)
*H01L 41/113* (2006.01)

(58) Field of Classification Search
USPC .................................... 310/324, 328, 348
See application file for complete search history.

(56) References Cited

FOREIGN PATENT DOCUMENTS

| | | |
|---|---|---|
| DE | 102008050266 | 4/2010 |
| EP | 0751380 | 1/1997 |
| EP | 2650668 | 10/2013 |
| WO | 2011/073414 | 6/2011 |

OTHER PUBLICATIONS

German Patent & Trademark Office, "Search Report" issued in German Patent Application No. 10 2016 113 447.3, dated Jun. 14, 2017, document of 9 pages.
German Patent & Trademark Office, "Office Action", and English translation thereof, issued in German Patent Application No. 102016113447.3, dated Aug. 3, 2017, document of 4 pages.
German Patent & Trademark Office, "Decision to Grant Patent", and English translation thereof, issued in German Patent Application No. 102016113447.3, dated Apr. 6, 2018, document of 10 pages.

* cited by examiner

VIBRATION SENSOR AND METHOD FOR OPTIMIZING A PIEZOELECTRIC DRIVE

CROSS REFERENCE TO RELATED APPLICATIONS

This application is a § 371 National Phase of PCT/EP2017/066787, filed Jul. 5, 2017, the entirety of which is incorporated by reference and which claims priority to German Patent Application No. 10 2016 113 447.3, filed Jul. 21, 2016.

BACKGROUND

The application relates to a vibration sensor and a method for optimizing a piezoelectric drive for such a vibration sensor.

Various types of vibration sensors are known from the prior art. They are frequently used as vibration level switches with a diaphragm that can be caused to oscillate and a drive for oscillating the diaphragm and/or for tapping of an oscillation of the diaphragm and a mechanical oscillator arranged on the diaphragm, wherein frequently piezoelectric elements are used as drives. Such vibration level switches are used in particular for detecting fill levels or limit levels in containers for flowable and fluidizable media, in particular for fluids or bulk materials. Depending on the fill level in the container, the vibration level switches are in contact with the medium or not, such that a vibration frequency of the diaphragm or of the mechanical osciliator arranged on the diaphragm is influenced by the contact with the medium.

The vibration sensors known from the prior art are frequently operated with a bonded drive, wherein in the case of this type of drive, the piezoelectric element has at least two electrical contact structures in order for the disk-shaped piezoelectric element to interconnect a compensation element for adjustment of thermal expansion coefficients of the diaphragm and piezoelectric element to cause the diaphragm to oscillate and acquire osciliations of the diaphragms and convert them into a measurement signal. At least one first electrical contact structure is applied on an upper side of the piezoelectric element and at least one second electrical contact structure on a lower side of the piezoelectric element. Typically metallizations applied over the surface are used for contacting the piezoelectric element.

In the piezoelectric drives known from the prior art, as a rule contact is made over the entire surface of the lower side of the piezoelectric element, i.e. the surface of the piezoelectric element facing the diaphragm, while the surface of the piezoelectric element pointing away from the diaphragm of the piezoelectric element is provided either with one or with more electrical contact structures. By way of example, the upper side of the piezoelectric element can be quadruple segmented and in each case two segments arranged diagonally opposed can be in joint electrical contact. In this way it is possible using two of the contact structures to couple movement into the diaphragm and simultaneously to use the two other contact structures to acquire an oscillation resonance frequency and/or amplitude of the diaphragm. If the surface is not in segmented contact then stimulus and detection can only be carried out sequentially.

In the case of the piezoelectric elements that are typically used, a voltage is generated for detection which is proportional to a curvature of the piezoelectric element. Conversely, an applied voltage is converted to a curvature of the piezoelectric element proportional to an applied voltage.

In the vibration sensors known from the prior art the geometry and form of the electrical contact structure of the piezoelectric element are determined by experiments. The piezoelectric elements are typically designed in the shape of a disk and due to the manufacturing technology used, as a rule have a circular base area. As already mentioned, typically contact is made over the entire surface of the lower side of the piezoelectric element. Depending on the area of application it is further customary in the prior art to provide the upper side of the piezoelectric element either with an electrical contact structure over the entire surface or in multiple segments with a likewise approximately full surface contact structure. In sonic manifestations the lower side is not in contact.

SUMMARY

The application addresses the problem of further developing a vibration sensor with a piezoelectric drive such that it has an improved reception signal, provides an improved rendering of an applied voltage into a mechanical oscillation and as a result makes possible an improved signal detection. Further, the application addresses the problem of specifying a method for optimizing a piezoelectric drive for a vibration sensor.

These problems are solved by a vibration sensor and a method for optimizing a piezoelectric drive for a vibration sensor having the features and structures recited herein.

A vibration sensor according to the disclosure comprising a diaphragm that can be stimulated so as to oscillate by means of a piezoelectric drive and for acquiring oscillations of the diaphragm has a mechanical oscillator arranged on the diaphragm and at least one piezoelectric element with at least one first electrical contact structure on an upper side of the piezoelectric element and at least one second electrical contact structure on a lower side of the piezoelectric element and is characterized by the fact that the at least one piezoelectric element is designed such that an active area of the piezoelectric element corresponds to a area of a mechanical deformation of the unidirectional curvature of the diaphragm during a pre-defined eigenmode of the mechanical oscillator.

The mechanical oscillators arranged on the diaphragm can have various designs and in each case can have a plurality of different eigenmodes.

An eigenmode occurs in each case during a fundamental resonance frequency pre-defined by the geometric design of the oscillation system, wherein the resonance frequencies of the various eigenmodes differ from one another. The vibration sensors on which the disclosure is based have preferred eigenmodes, which for example are characterized by the fact that they are optimized with respect to transfer of force and/or torque to a process connection, by means of which the vibration sensor is arranged in a container. Preferred are eigenmodes and corresponding resonance frequencies for which a transfer of force and torque is minimal. As a rule the pre-defined eigenmode will correspond to this preferred eigenmode and the piezoelectric drive will be optmized to it.

In the present application, the active surface of the piezoelectric element is understood as the surface that is used for the detection of an oscillation of the diaphragm and/or for transferring an oscillation to the diaphragm with the assistance of the piezoelectric effect.

Due to the fact that a piezoelectric voltage generated by the piezoelectric elements used is proportional to a curvature of the piezoelectric element, for all oscillation systems both positive and negative voltage components are multiplexed and thus, an achievable signal amplitude is reduced. One reason for the positive and negative signal components lies in the fact that the used diaphragm has both positive and negative curvature components in an oscillation of the mechanical oscillator, said curvature components being tapped off and the signals thereof are multiplexed in the vibration sensors from the prior art.

Hence, the present disclosure uses solely rectified signal components for signal analysis and also causing only those components of the diaphragm to oscillate that deform in the same direction during the pre-defined eigenmode or the corresponding resonance frequency. By means of a finite element simulation the deformation in the diaphragm in a preferred eigenmode was tested and by forming the second derivative the corresponding curvature of the diaphragm, which is proportional to the achievable piezo voltage, was determined. If a piezo voltage for signal detection is tapped off only in the region of the rectified curvature of the diaphragm and/or a voltage is only applied in this region, in order to produce a mechanical deformation of the diaphragm, the achievable electrical and mechanical amplitude is maximized and hence the signal transmission is optimized.

A restriction of the active surface of the piezoelectric element to a surface of a mechanical deformation of a rectified curvature of the diaphragm can be carried out, for example, by having at least one of the electrical contact structures adjusted and having a surface that corresponds essentially to a surface of the rectified curvature of the deformation of the diaphragm that develops in the pre-defined eigenmode of the mechanical oscillator.

By tapping off a piezo voltage only in the region of the rectified curvature a greater voltage amplitude is achieved and thus also a better detection of the relevant oscillation frequency is made possible. In terms of electrical signals, a noise occurring in the system has a greater distance from the useful signal. The signal-noise ratio is increased.

In one preferred configuration an outer contour of the surface runs along a line of a curvature change of the diaphragm in the pre-defined eigenmode.

A curvature change in this application is understood as a change of the sign of the second derivative of the diaphragm deformation.

In a variant of the vibration sensor of the present application that is particularly easy to manufacture, the first contact structure is adapted and the second contact structure is in contact essentially over the entire surface on the lower side of the piezoelectric element. By means of such a design, supply and return lines for the electrical contact structure of the piezoelectric element can be implemented particularly easily and thus manufacturing costs can be saved.

The electrical contact structures of the piezoelectric element can be implemented particularly easily by metallizations of a surface of the piezoelectric element. Corresponding metallizations can be easily manufactured and cost-effectively implemented by selective coating methods or with the assistance of photolithographic processes, which for example are well known in the semiconductor industry.

An optimization of the achievable signal amplitude or oscillation amplitude can be achieved if, in the case of a piezoelectric element with an essentially circular base area surface sections of the upper side that go beyond the outer contour of the first contact structure are in electrical contact with a third electrical contact structure insulated from the first contact structure, and are connected to the second contact structure.

In this way the surface sections going beyond the outer contour of the first contact structure are effectively short-circuited so that a capacitance develops only in the region of the first contact structure and thus a greater electrical voltage can be tapped off of it. Also, in the stimulus of the piezoelectric element, an applied stimulating voltage does not branch, so that a greater electrical field and thus a greater mechanical movement of the piezoelectric element can be achieved.

A connection of the surface sections and the second contact structure can occur, for example, by means of a peripheral contact structure formed as metallization guided over the edge of the piezoelectric element.

Ordinarily the diaphragm is firmly connected circumferentially to a wall running essentially perpendicular to a diaphragm plane, such that it is effectively fixed in the diaphragm. In this way an oscillatable system can be easily manufactured. On the basis of this fixation of the diaphragm differing directions of curvature arise and thus different signs of the curvatures, such that an appropriate adjustment of the drive is necessary.

A compensation element, for example a compensation ceramic can be arranged between the diaphragm and the piezoelectric element for the adjustment of thermal expansion coefficients of the diaphragm and piezoelectric element. By means of such a typically disk-shaped compensation ceramic, thermal expansions of the diaphragm can be absorbed, and electrical voltages caused by thermal voltages can be largely prevented.

The piezoelectric drive is advantageously formed from a single piezoelectric element with a preferably circular base area, wherein the piezoelectrc drive is preferably bonded to the diaphragm or the compensation element. By bonding the drive to the diaphragm or the compensation element, a cost-effective manufacture is made possible with simultaneously good mechanical coupling.

A further optimization can occur if a base area of the piezoelectric element corresponds essentially to the surface of a rectified curvature of the deformation of the diaphragm developing in the pre-defined eigenmode of the mechanical oscillator. Thus, in addition or as an alternative to an adjustment of the surface of the electrical contact structure, an outer contour of the piezoelectric element can also be adjusted. This configuration enables an ideal oscillation detection and stimulus of the diaphragm to oscillate, although with this variant it is not possible to rely on ordinarily available piezoelectric elements, and custom-made designs with an adjusted outer contour are necessary.

In one design variant the mechanical oscillator can be formed as a tuning fork with two paddles at an equal distance to a center of the diaphragm and arranged essentially orthogonally to the diaphragm plane and the preferred mode can correspond to a clap mode of the two paddles. Tuning forks with two paddles arranged opposite each other have several resonance frequencies and eigenmodes coupled therewith. The two most important eigenmodes are referred to as the clap mode and the sway mode.

In the clap mode the two paddles of the tuning fork move towards and away from each other, while in the so-called sway mode they move parallel past one another to the right and left. Since from the perspective of a process connection, the clap mode is virtually free of force and torque and the sway mode in comparison would bring a greater torque to the process connection, the objective is to induce only the clap move and to avoid the sway mode. This can be achieved by means of a design of the drive corresponding to the present application.

To this end, the drive must be oriented and arranged relative to a mechanical oscillator such that chiefly the preferred mode is induced.

In the case of a vibration sensor with a correspondingly developed tuning fork, the first contact structure has a length to width ratio of between 5 to 4 and 6 to 4. By means of a corresponding design of the first contact structure an approximately reliably determinable result can be achieved through simulation.

A method according to the application for optimizing a piezoelectric drive for a vibration sensor comprising a diaphragm that can be stimulated so as to oscillate by means of a piezoelectric drive with at least one piezoelectric element and a mechanical oscillator arranged on the diaphragm has the following steps:

Determining a preferred eigenmode of the preferred oscillator,

Determining an area of points of the same direction of curvature of the diaphragm in the preferred eigenmode, Forming an area of an electrical contact structure of the piezoelectric element corresponding to the determined area.

BRIEF DESCRIPTION OF THE DRAWINGS

The application will be described in greater detail in the following referring to exemplary embodiments by means of the attached figures. The figures show.

DETAILED DESCRIPTION

Figure 1B:
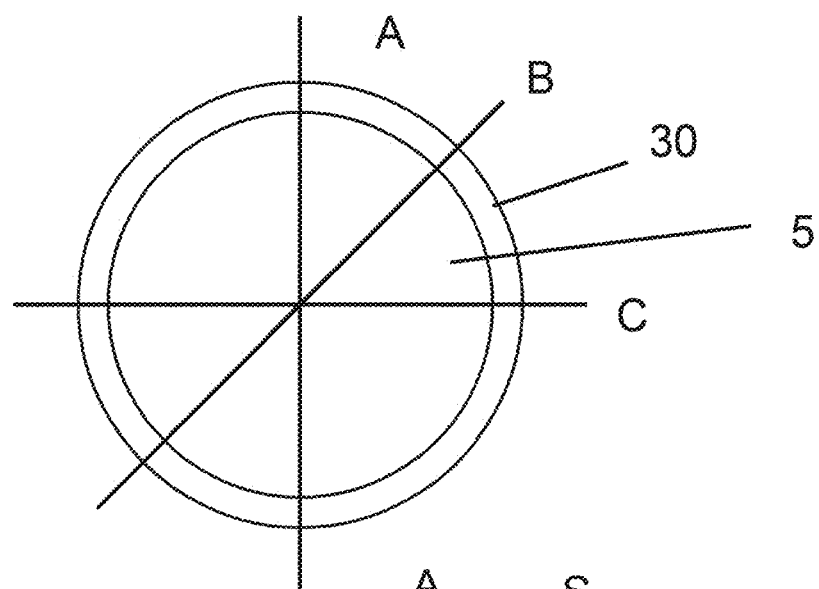
FIG. 1b shows a top view of the diaphragm in FIG. 1a, FIG. 2a shows characteristic lines of a diaphragm deformation, of a slope of the corresponding deformation and in a curvature of the diaphragm in a section through the diaphragm of FIG. 1b along line A.
Figure 1A:
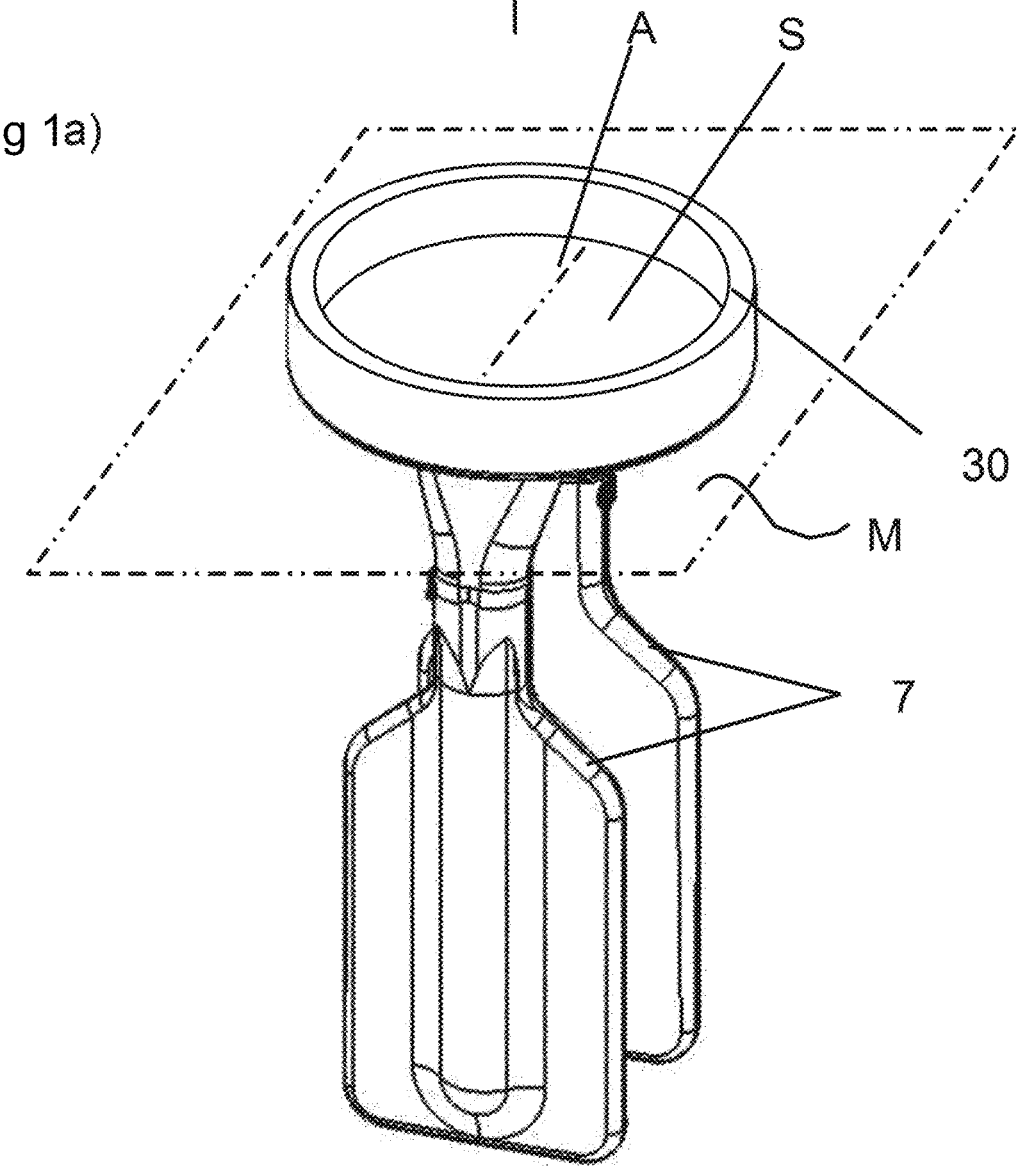
FIG. 1a shows a perspective illustration of a diaphragm of a vibration sensor with a mechanical oscillator arranged thereon.

FIG. 1a shows a perspective representation of a mechanical oscillation unit of a vibration sensor 1 according to the present application. The mechanical oscillation unit is essentially formed by a diaphragm 5, which is firmly connected to a circumferential wall 30 and oscillatably fixed in it. A mechanical oscillator 7 is arranged on the diaphragm 5 in this representation on the underside, which corresponds to a side of the diaphragm 5 facing a medium, said mechanical oscillator being formed in this exemplary embodiment as paddles opposing each other and in parallel alignment, arranged orthogonally on the diaphragm 5. In this illustration a line A is marked on the diaphragm 5, said line corresponding to a connecting line of a base of the two paddies.

Line A is also marked in the top view in FIG. 1b and denotes a line of intersection, subsequently also referred to as a section and at an angle of 0°. In FIG. 1b lines B and C are indicated which denote a section at an angle of 45° (Line B) and at an angle of 90° (Line C).

Figure 2A:
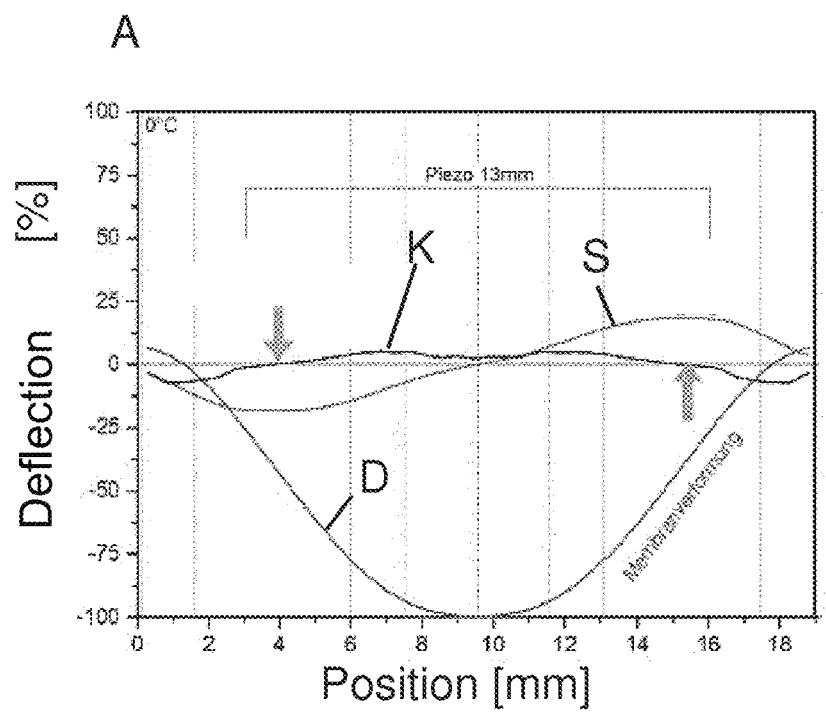
FIG. 2b shows the characteristic lines of FIG. 2a in a section alone; line B.
FIG. 2c shows the characteristic lines of FIG. 2a in a section along line C.
Figure 2B:
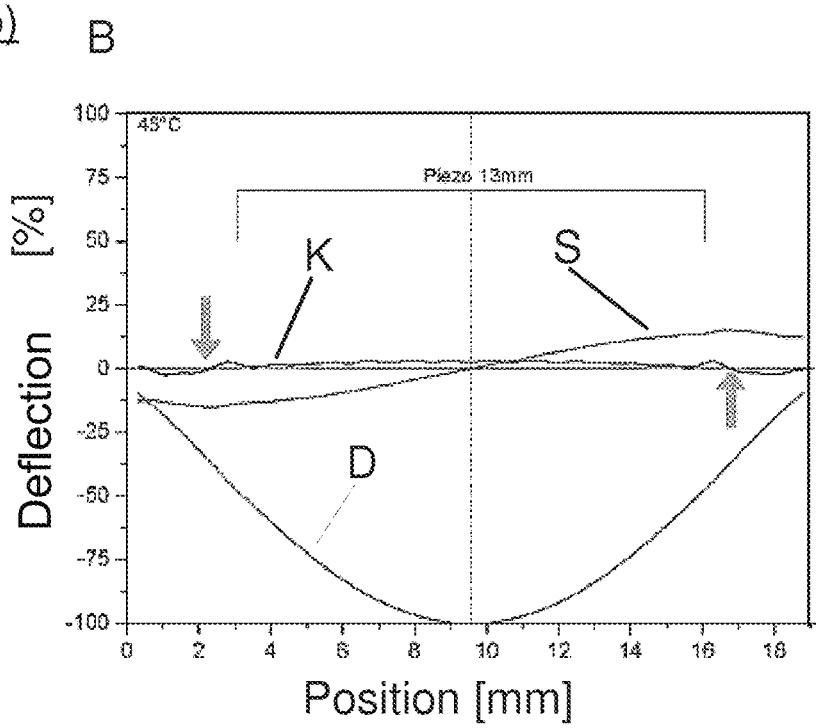
Figure 2C:
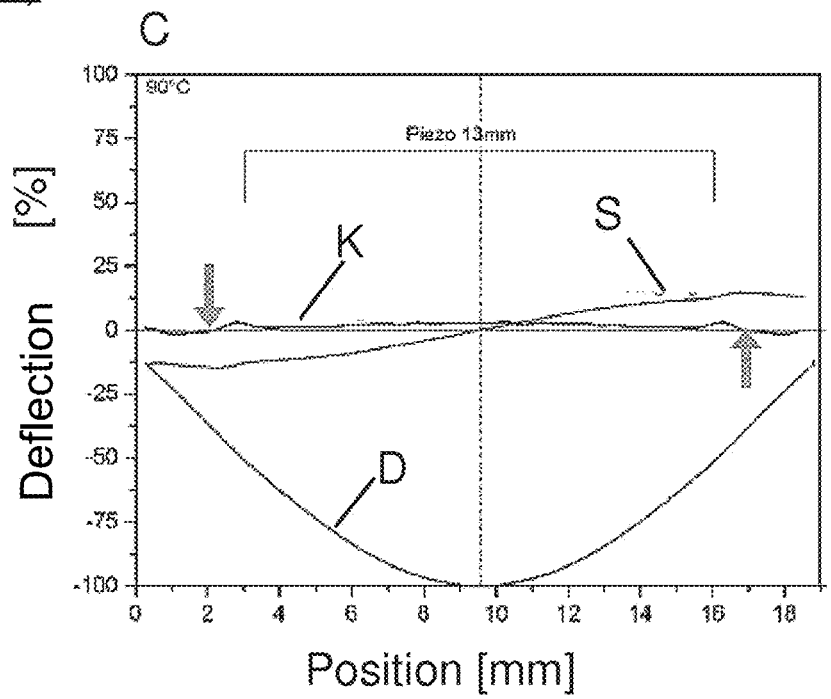

In FIGS. 2a to c the diaphragm deformation D, a resulting slope S and a likewise resulting curvature K are indicated. The characteristic lines of FIGS. 2a to c were determined for a diaphragm with a diameter of 19 mm.

Since the diaphragm 5 is connected on its edges to the wall 30 and hence is fixed, the deflection in the edge region, i.e. at a position below of 0 mm and 19 mm, is 5 or approximately 0, respectively. By means of the differentiation of the diaphragm deformation designated as D the slope S is determined at each point of the deformed diaphragm 5 and by another differentiation the curvature K is determined. Regarding the curvature K, the respective point of intersection of characteristic line K with the x-axis is further indicated by arrows. This point indicates a change of sign of curvature K. As is evident from FIGS. 2a to 2c, the point of intersection of curvature K with the x-axis in FIG. 2a is about 4 mm and 14 mm and in FIG. 2b is about 2.5 mm and 16.5 mm and in FIG. 2c is about 2 mm and 17 mm. Between these two points the curvature has in each case a positive value, while it has negative values outside of these two points.

In the exemplary embodiment shown in FIGS. 1a) and 1b) the two mainly occurring eigenmodes of the mechanical oscillator 7 are only 57 Hz away from each other, such that by means of a corresponding design of the drive an improved and unambiguous stimulus of the preferred mode is achieved.

Figure 3:
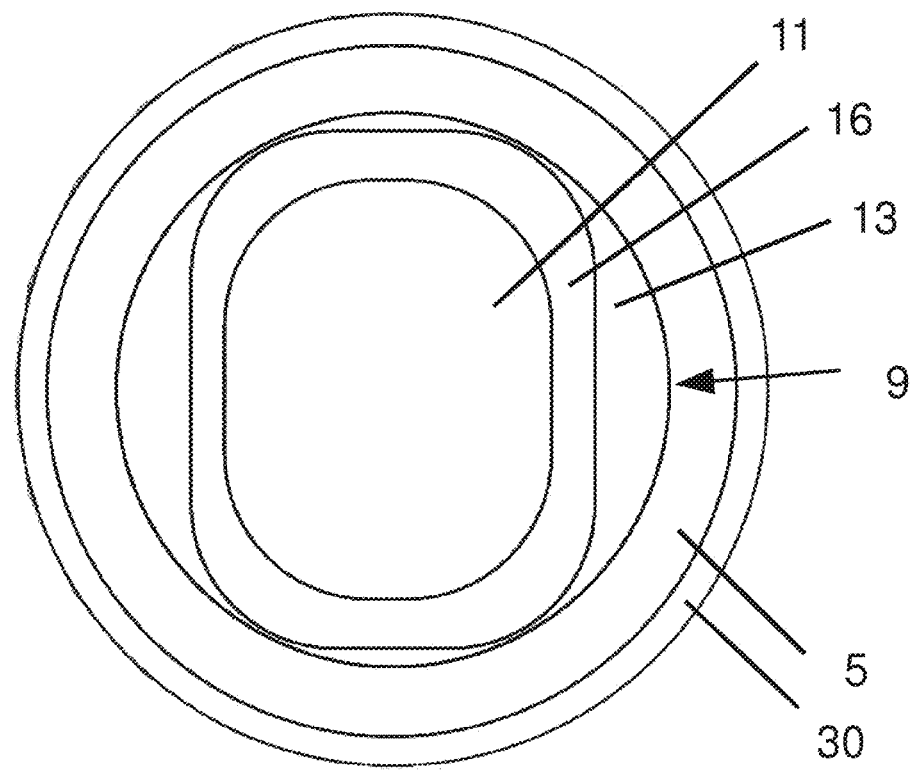
FIG. 3 shows a schematic representation of a structure of a resulting piezoelectric element in top view.
Figure 5:
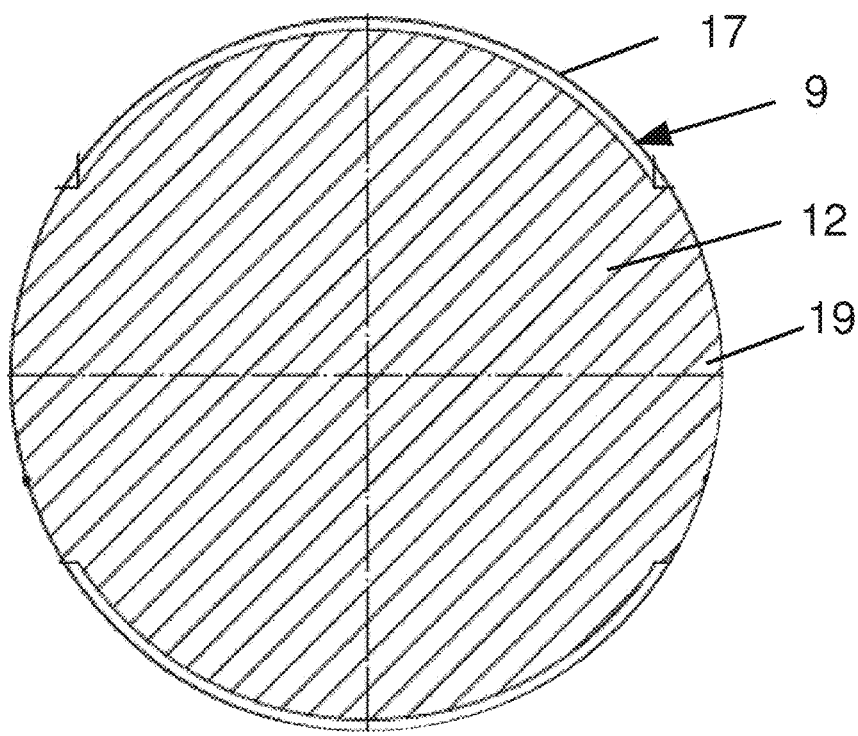
FIG. 5 shows the lower side of the piezoelectric element from FIG. 4.

Based on this knowledge, the optimized structure of a piezoelectric element 9 schematically illustrated in FIG. 3 can be derived. The diaphragm 5 is shown in a top view, said diaphragm being fixed in the circumferential wall 30. A piezoelectric element 9 is arranged on the diaphragm 5, said element having an optimized first electrical contact structure 11 corresponding to the knowledge illustrated in FIGS. 2a to 2c. A second electrical contact structure 12 of the piezoelectric element 9 is applied over the entire surface on the lower side of the piezoelectric element 9, as can be seen in FIG. 5. A third contact structure 13 of surface sections of the upper side of the piezoelectric element 9, which go beyond the contour of the first electrical contact structure 11 is electrically insulated via an intermediate insulation 16 from the first electrical contact structure 11 and is connected via a peripheral contact structure 19 to the second electrical contact structure 12 of the lower side of the piezoelectric element 9.

Figure 4:
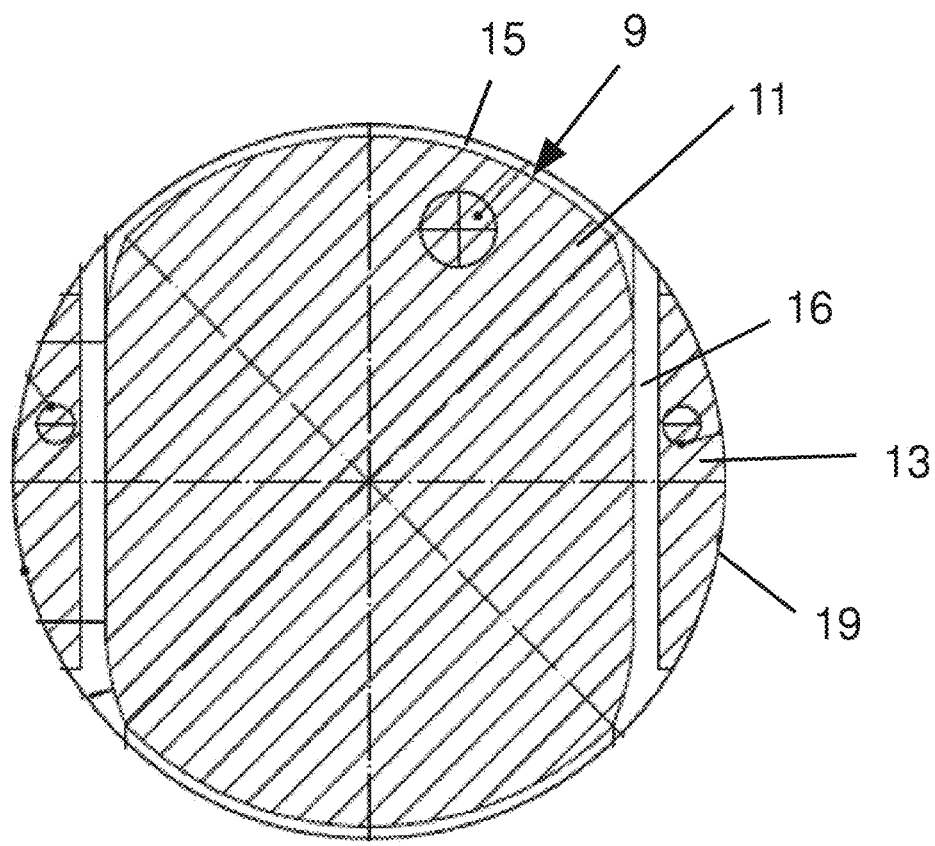
FIG. 4 shows the upper side of an exemplary embodiment of a piezoelectric element formed corresponding to FIG. 3

Proceeding from the schematic structure of a piezoelectric element 9 according to this disclosure shown in FIG. 3 concrete exemplary embodiments illustrated in FIGS. 4 and 5 can be derived. These exemplary embodiments are in particular optimized with respect to the area of the electrical contact structures 11, 12, 13 and the necessary insulations. The first electrical contact structure 11 is indicated over a large area in a central region of the piezoelectric element 9 and is surrounded by a first edge insulation 15 to the edge of the piezoelectric element 9. Between the first electrical contact structure 11 and the third electrical contact structure 13 an intermediate insulation 16 is provided, which electrically insulates the first contact structure 11 and the third electrical contact structure 13 from each other. The third electrical contact structure 13 for its part guided to the edge of the piezoelectric element 9 and guided by means of a peripheral contact structure 19 over the edge of the piezoelectric element 9 to the second electrical contact structure 12.

The second electrical contact structure 12 is shown in the main in FIG. 5, wherein in edge regions, in which no third electrical contact structure 13 is arranged on the upper side of the piezoelectric element 9, the second electrical contact structure is formed spaced apart from and insulated by a second edge insulation 17 from the edge of the piezoelectric element 9. In the region in which the third electrical contact structure 13 is arranged on the upper side, the second electrical contact structure 12 is also guided to the edge of the piezoelectric element 9 and is connected there in the peripheral contact structure 19, so that the second electrical connection 12 and the third electrical contact structure 13 are connected.

REFERENCE LIST 1 vibration sensor
3 piezoelectric drive
5 diaphragm
7 mechanical oscillator
11 first electrical contact structure
12 second electrical contact structure
13 third electrical contact structure
15 first edge insulation
16 intermediate insulation
17 second edge insulation.
19 contact structure
28 compensation element
30 wall
A section 0°
R section 45°
C section 90°
M diaphragm plane
D deformation
S slope
K curvature

The invention claimed is:

1. A vibration sensor, comprising:
a piezoelectric drive with a piezoelectric element;
a diaphragm arranged to be stimulated by the piezoelectric drive so as to oscillate;
a mechanical oscillator arranged on the diaphragm;
wherein the piezoelectric element of the piezoelectric drive comprises a first electrical contact structure on an upper side of the piezoelectric element and a second electrical contact structure on a lower side of the piezoelectric element; and
wherein the piezoelectric element is designed such that an active area of the piezoelectric element corresponds to an area of a mechanical deformation of a rectified curvature of the diaphragm during a pre-defined eigenmode of the mechanical oscillator.

2. The vibration sensor according to claim 1, wherein one of the first electrical contact structure, the second electrical contact structure, or both the first electrical contact structure and the second electrical contact structure, is adopted and has an area that corresponds substantially to an area of the rectified curvature of the deformation of the diaphragm forming in the pre-defined eigenmode of the mechanical oscillator.

3. The vibration sensor according to claim 1, wherein an outer contour of the active area of the piezoelectric element runs along a line of a curvature change of the diaphragm in the pre-defined eigenmode.

4. The vibration sensor according to claim 1, wherein the first electrical contact structure is adopted and the second electrical contact structure is substantially in contact over substantially the entire active area of the piezoelectric element on the lower side of the piezoelectric element.

5. The vibration sensor according to claim 1, wherein the first electrical contact structure, the second electrical contact structure, or both the first electrical contact structure and the second first electrical contact structure, are designed as metallization of the active area of the piezoelectric element.

6. The vibration sensor according to claim 1, wherein the piezoelectric element has a substantially circular base area, and the active area of the piezo electric element on the upper side extends beyond an outer contour of the first electrical contact structure and is electrically connected with a third electrical contact structure, wherein the third electrical contact structure is insulated from the first electrical contact structure, and the active area of the piezo electric element is connected to the second electrical contact structure.

7. The vibration sensor according to claim 6, wherein a connection of the active area of the piezo electric element and the second electrical contact structure occurs by a peripheral contact structure designed as metallization guided over an edge of the piezoelectric element.

8. The vibration sensor according to claim 1, wherein the diaphragm is firmly connected circumferentially to a wall running substantially perpendicular to a diaphragm plane.

9. The vibration sensor according to claim 1, wherein a compensation element is arranged between the piezoelectric element and the diaphragm.

10. The vibration sensor according to claim 9, wherein the piezoelectric drive is formed from a single piezoelectric element with a circular base area, which is bonded to the diaphragm or a compensation element.

11. The vibration sensor according to claim 1, wherein a base area of the piezoelectric element corresponds substantially to an area of the rectified curvature of the deformation of the diaphragm forming during the pre-defined eigenmode of the mechanical oscillator.

12. The vibration sensor according to claim 1, wherein the mechanical oscillator comprises a tuning fork with two paddles at an equal distance to a center of the diaphragm and arranged substantially orthogonally to a diaphragm plane, and the mechanical oscillator includes a clap mode of the two paddles.

13. The vibration sensor according to claim 12, wherein the piezoelectric drive is arranged oriented relative to the mechanical oscillator such that the clap mode is induced.

14. The vibration sensor according to claim 1, wherein the first electrical contact structure has a length to width ratio of between 5 to 4 and 6 to 4.

15. A method for optimizing a piezoelectric drive for a vibration sensor having a diaphragm that can be stimulated so as to oscillate by a piezoelectric drive with at least one piezoelement, and having a mechanical oscillator arranged on the diaphragm, comprising the following steps:
Determining a preferred eigenmode of the mechanical oscillator,
Determining an area of points of a same direction of curvature of the diaphragm in the preferred eigenmode,
Forming an electrical area of a first and second contact structure of the piezoelectric element corresponding to the determined area of points, and
adopting a contour of the first contact structure, the second contact structure of both the first and second contact structure.

* * * * *